(12) United States Patent
Feltner et al.

(10) Patent No.: US 8,289,709 B2
(45) Date of Patent: Oct. 16, 2012

(54) INVERTER SYSTEM

(75) Inventors: David Feltner, Sylvania, OH (US); David E. Olin, Toledo, OH (US); Peter Gerhardinger, Maumee, OH (US); Richard Ashton, Perrysburg, OH (US)

(73) Assignee: Nextronex Inc., Millbury, OH (US)

( * ) Notice: Subject to any disclaimer, the term of this patent is extended or adjusted under 35 U.S.C. 154(b) by 193 days.

(21) Appl. No.: 12/907,257

(22) Filed: Oct. 19, 2010

(65) Prior Publication Data
US 2011/0110039 A1    May 12, 2011

Related U.S. Application Data

(60) Provisional application No. 61/260,158, filed on Nov. 11, 2009.

(51) Int. Cl.
*H05K 7/20* (2006.01)

(52) U.S. Cl. .............. 361/695; 361/679.46; 361/679.47; 361/679.48; 361/679.49; 361/679.5; 361/690; 361/692; 361/697; 165/80.3; 165/104.33; 165/185; 363/141; 454/184

(58) Field of Classification Search ........... 361/679.46–679.54, 690–697, 361/704–712, 722–728; 165/80.2, 80.3, 165/104.33, 104.34, 121–126, 185; 312/223.1, 312/223.2, 223.3, 236; 454/184; 363/15, 363/26, 39, 63–75, 141–143, 243–246, 251, 363/255, 292; 307/44, 75, 77, 112, 143–148
See application file for complete search history.

(56) References Cited

U.S. PATENT DOCUMENTS

| 4,237,521 | A | * | 12/1980 | Denker | 361/697 |
|---|---|---|---|---|---|
| 4,459,638 | A | * | 7/1984 | Brehm et al. | 361/697 |
| 4,520,425 | A | * | 5/1985 | Ito | 361/697 |
| 4,772,999 | A | * | 9/1988 | Fiorina et al. | 363/141 |
| 4,872,102 | A | * | 10/1989 | Getter | 363/141 |
| 5,170,336 | A | * | 12/1992 | Getter et al. | 363/141 |
| 5,485,350 | A | | 1/1996 | Hecht et al. | |
| 5,812,373 | A | * | 9/1998 | Hwang | 361/704 |
| 5,831,847 | A | * | 11/1998 | Love | 363/141 |
| 6,046,921 | A | * | 4/2000 | Tracewell et al. | 363/141 |
| 6,233,149 | B1 | * | 5/2001 | Bailey et al. | 361/704 |
| 6,930,883 | B2 | * | 8/2005 | Hsieh et al. | 361/695 |
| D563,318 | S | * | 3/2008 | Higuchi | D13/110 |
| 7,397,653 | B2 | * | 7/2008 | Taylor | 361/676 |
| 7,436,660 | B2 | * | 10/2008 | Pedoeem et al. | 361/690 |
| 7,817,419 | B2 | * | 10/2010 | Illerhaus | 361/692 |
| 7,974,094 | B2 | * | 7/2011 | Hendrix et al. | 361/695 |
| 8,023,266 | B2 | * | 9/2011 | Russell et al. | 361/702 |
| 8,159,820 | B2 | * | 4/2012 | Ibori et al. | 361/695 |
| 2006/0171115 | A1 | | 8/2006 | Cramer | |
| 2007/0279863 | A1 | | 12/2007 | Illerhaus | |
| 2008/0042492 | A1 | | 2/2008 | Gleason et al. | |
| 2008/0304220 | A1 | | 12/2008 | Bremicker et al. | |
| 2010/0118488 | A1 | * | 5/2010 | Hoffman et al. | 361/691 |
| 2010/0302728 | A1 | * | 12/2010 | Knaup et al. | 361/690 |
| 2010/0302731 | A1 | * | 12/2010 | Belikoff et al. | 361/697 |
| 2011/0310532 | A1 | * | 12/2011 | Niwa et al. | 361/601 |

* cited by examiner

*Primary Examiner* — Michail V Datskovskiy
(74) *Attorney, Agent, or Firm* — Fraser Clemens Martin & Miller LLC; J. Douglas Miller

(57) ABSTRACT

A housing includes a first chamber having an exhaust aperture to provide fluid communication with an outside environment, a wall disposed in the first chamber and containing an electrical component, wherein a thermal energy generated by the electrical component is transferred from the first chamber to the outside environment through the exhaust aperture, a second chamber formed adjacent the first chamber and including a control means for the electrical component, and a means for selectively providing access to the first chamber and the second chamber.

20 Claims, 16 Drawing Sheets

INVERTER SYSTEM

CROSS-REFERENCE TO RELATED APPLICATION

This application claims the benefit of U.S. Provisional Patent Application Ser. No. 61/260,158 filed on Nov. 11, 2009, the entire disclosure of which is incorporated herein by reference.

FIELD OF THE INVENTION

The present invention generally relates to an inverter. More particularly, the invention is directed to an inverter system for a solar grid.

BACKGROUND OF THE INVENTION

Solar inverters are part of photovoltaic installations that are used to feed electrical power into an electrical mains system. For this purpose, the photovoltaic installations have one or more photovoltaic generators, each of which includes one or more solar modules. Each solar module may have a multiplicity of interconnected solar cells. The electrical energy which is generated photovoltaically by the solar cells is then supplied to a solar inverter, which converts the DC voltage supplied to it to a regulated, standardized mains voltage.

The solar inverters typically include a number of heat-generating electronic components, for example low-frequency transformers, inductors and power semiconductors. Since the solar inverters are generally disposed outside of buildings, they must also be protected against the ingress of dust, dirt and water spray in order, for example, to meet the requirements for ingress-protection class IP 54 (e.g. dust protection, splash protection).

In principle, the electronic components in the solar inverter can be cooled by passing cooling air directly past the components. However, this does not allow adequate protection of the electronic components against dust and moisture. It is therefore common for the solar inverter to be provided with a heat sink through which the cooling air is passed, and to which electronic components may be thermally conductively connected. Since, in this case, the electronic components do not come into contact with the cooling air, the cooling provided by the heat sink is not always adequate.

It would be desirable to develop an inverter system including a unique configuration of components to thermally manage a number of heat-generating electronic components, while maintaining an ingress protection of the electrical components.

SUMMARY OF THE INVENTION

Concordant and consistent with the present invention, an inverter system including a unique configuration of components to thermally manage a number of heat-generating electronic components, while maintaining an ingress protection of the electrical components, has surprisingly been discovered.

In one embodiment, a housing comprises: a first chamber having an exhaust aperture to provide fluid communication with an outside environment; a wall disposed in the first chamber and containing an electrical component, wherein a thermal energy generated by the electrical component is transferred from the first chamber to the outside environment through the exhaust aperture; a second chamber formed adjacent the first chamber and including a control means for the electrical component; and a means for selectively providing access to the first chamber and the second chamber.

In another embodiment, a housing comprises: a first chamber having an exhaust aperture to provide heat transfer with an outside environment; a second chamber formed adjacent the first chamber and including a disconnect plate; a wall separating at least a portion of the first chamber to define a third chamber, the wall containing an inverter assembly in electrical communication with the disconnect plate, wherein at least a portion of the thermal energy generated by the inverter assembly is transferred from the first chamber to the outside environment through the exhaust aperture; and a means for selectively providing access to the first chamber and the second chamber.

In yet another embodiment, a housing for an inverter comprises: a floor having a means to mount the housing in a substantially static position; a plurality of side walls coupled to the floor and at least partially defining: a first chamber having an exhaust aperture to provide fluid communication with an outside environment; and a second chamber adjacent the first chamber and including a control means; a chamber wall separating at least a portion of the first chamber to define a third chamber, the chamber wall containing an inverter assembly in electrical communication with the control means, wherein at least a portion of the thermal energy generated by the inverter assembly is transferred from the first chamber to the outside environment through the exhaust aperture; a heatsink assembly disposed in the first chamber adjacent the chamber wall and in thermal communication with the inverter assembly; and a means for selectively providing access to the first chamber and the second chamber.

BRIEF DESCRIPTION OF THE DRAWINGS

The above, as well as other advantages of the present invention, will become readily apparent to those skilled in the art from the following detailed description of the preferred embodiment when considered in the light of the accompanying drawings in which.

DETAILED DESCRIPTION OF EXEMPLARY EMBODIMENTS OF THE INVENTION

Figure 1:
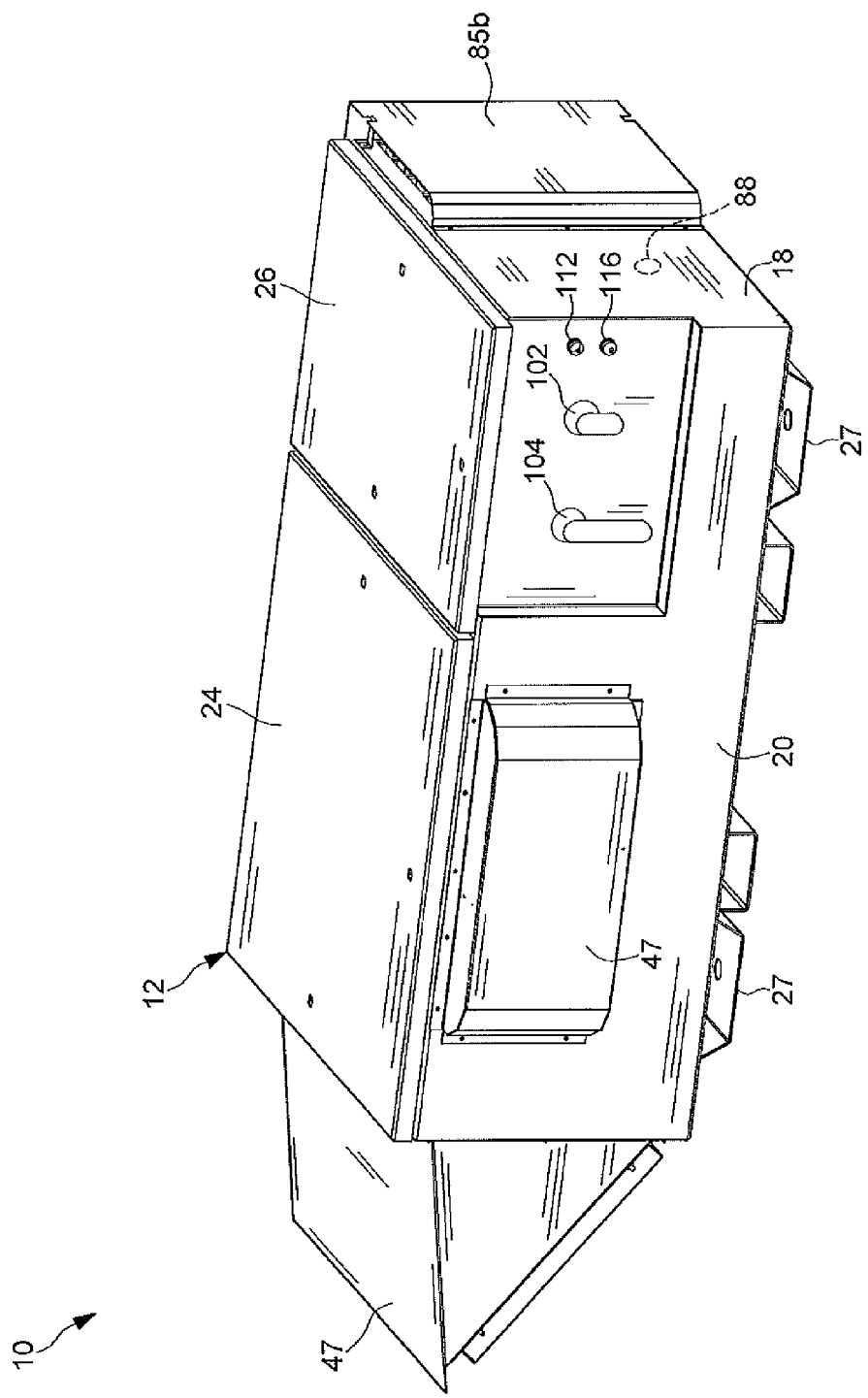
FIG. 1 is a perspective view of an inverter system according to an embodiment of the present invention, shown with a cover attached.

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

FIGS. 1-11 illustrate an inverter system 10 according to an embodiment of the present invention. As shown, the inverter system 10 includes a housing 12 or cabinet having a plurality of side walls 14, 16, 18, 20, a floor 22, and a plurality of removable covers 24, 26. As a non-limiting example, the floor 22 includes a plurality of perforations for thermal and water management. In certain embodiments, the floor 22 receives a plurality of feet 27 for mounting the inverter system 10 to the ground, a concrete pad, or other structure and providing a pre-determined ground clearance. It is understood that any number of punch-out holes and perforations may be used. It is further understood that any number of gaskets (not shown) may be used to provide a seal between the various components of the housing 12.

The housing 12 is effectively separated into a plurality of chambers, namely, a first chamber 28 (referred to as a ventilated chamber) and a second chamber 30 (referred to as an access chamber). In certain embodiments, the first chamber 28 is further divided to create a third chamber 32 (referred to as a sealed chamber) to house a plurality of electrical components. It is understood that any number of chambers may be used.

Figure 12:
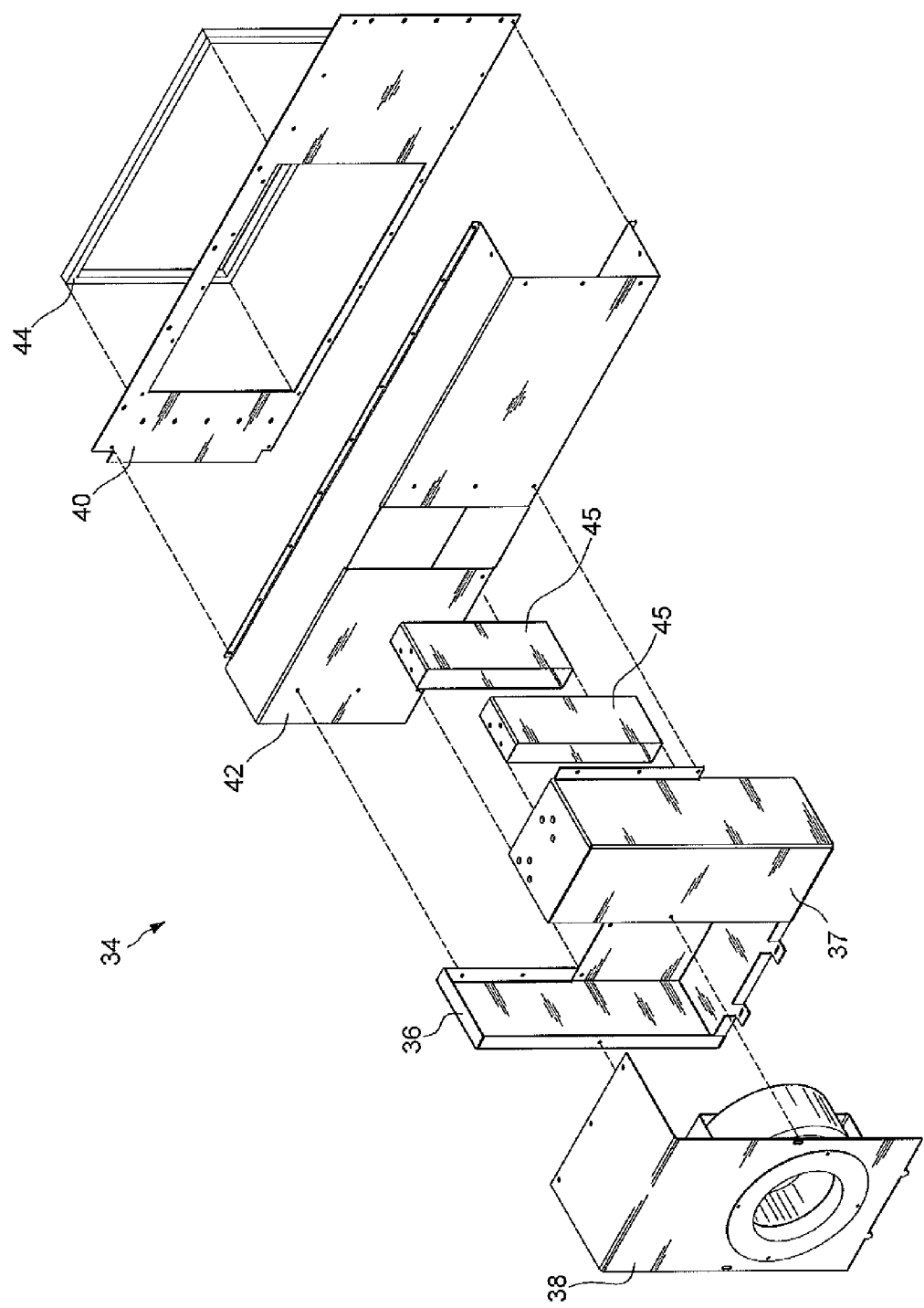
FIG. 12 is an exploded perspective view of a heat sink assembly according to an embodiment of the present invention.

The first chamber 28 includes a heatsink assembly 34 disposed therein. As more clearly shown in FIG. 12, the heat sink assembly 34 includes a plenum frame 36 defining a heat sink plenum 37 and adapted to receive a fan assembly 38 or a blower. The heat sink assembly 34 also includes a shroud support 40 with a heat sink shroud 42 coupled to one side of the shroud support 40 and a heat sink gasket 44 coupled to an opposite side thereof. As shown, the shroud support 40 cooperates with the plenum frame 36 to receive a heat sink (e.g. heat sink 56). In certain embodiments, the heatsink assembly 34 includes at least one air deflector 45 disposed in fluid communication with the fan assembly 38.

In certain embodiments, at least one wall 14, 16, 20 defining the first chamber 28 includes an exhaust aperture 46 formed therein. As such, the exhaust aperture 46 provides a fluid communication and heat transfer between the first chamber 28 and an outside environment. It is understood that the exhaust aperture 46 may include a protective covering 47 or hood to militate against contaminants entering the first chamber 28 through the exhaust aperture 46. It is further understood that the exhaust aperture 46 may include a screen (not shown), a valve, or a door to militate against contaminants entering the first chamber 28 through the exhaust aperture 46 (i.e. ingress protection).

In the embodiment shown, the first chamber 28 is further divided to create the third chamber 32 (the sealed chamber) to house a plurality of electrical components. Specifically, the third chamber 32 includes an inverter assembly 48, a fuse plate 50, and a capacitor plate 52. It is understood that the third chamber 32 may also include a plurality of circuits, circuit boards, and tie points to provide electrical communication between the various components of the inverter system 10.

Figure 13B:
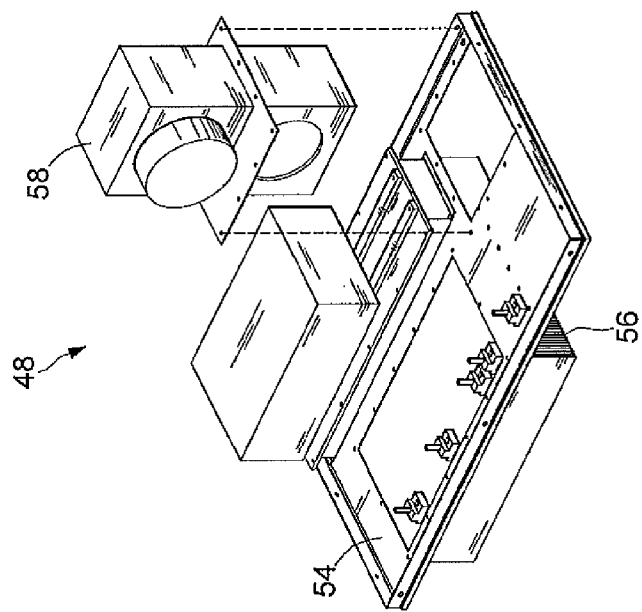
FIGS. 13A and 13B are exploded perspective views of an inverter assembly according to an embodiment of the present invention.
Figure 13A:
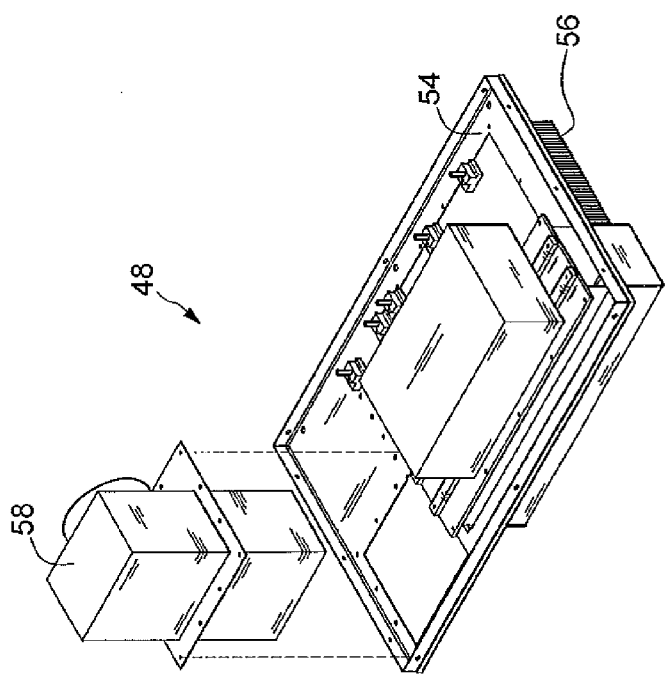

The inverter assembly 48 is disposed adjacent the heat sink assembly 34 and cooperates therewith to form a chamber wall separating and substantially sealing the first chamber 28 from the third chamber 32. As more clearly shown in FIGS. 13A and 13B, the inverter assembly 48 is a modular unit and includes an inverter 54 having a heat sink 56 disposed adjacent thereto. It is understood that the heat sink 56 is received by the heat sink assembly 34 disposed in the first chamber 28. The inverter assembly 48 also includes an aperture formed therein to receive a heat exchanger 58 therethrough, wherein the heat exchanger 58 extends though the chamber wall (e.g. formed from the inverter assembly 48 and the heat sink assembly) to manage a thermal energy generated by the inverter 54 and other components. As a non-limiting example, the heat exchanger 58 includes a cabinet fan manufactured by Noren Products Inc. It is further understood that the inverter assembly 48 is manufactured as a one-for-one replaceable component for simple and convenient maintenance and replacement.

Figure 14:
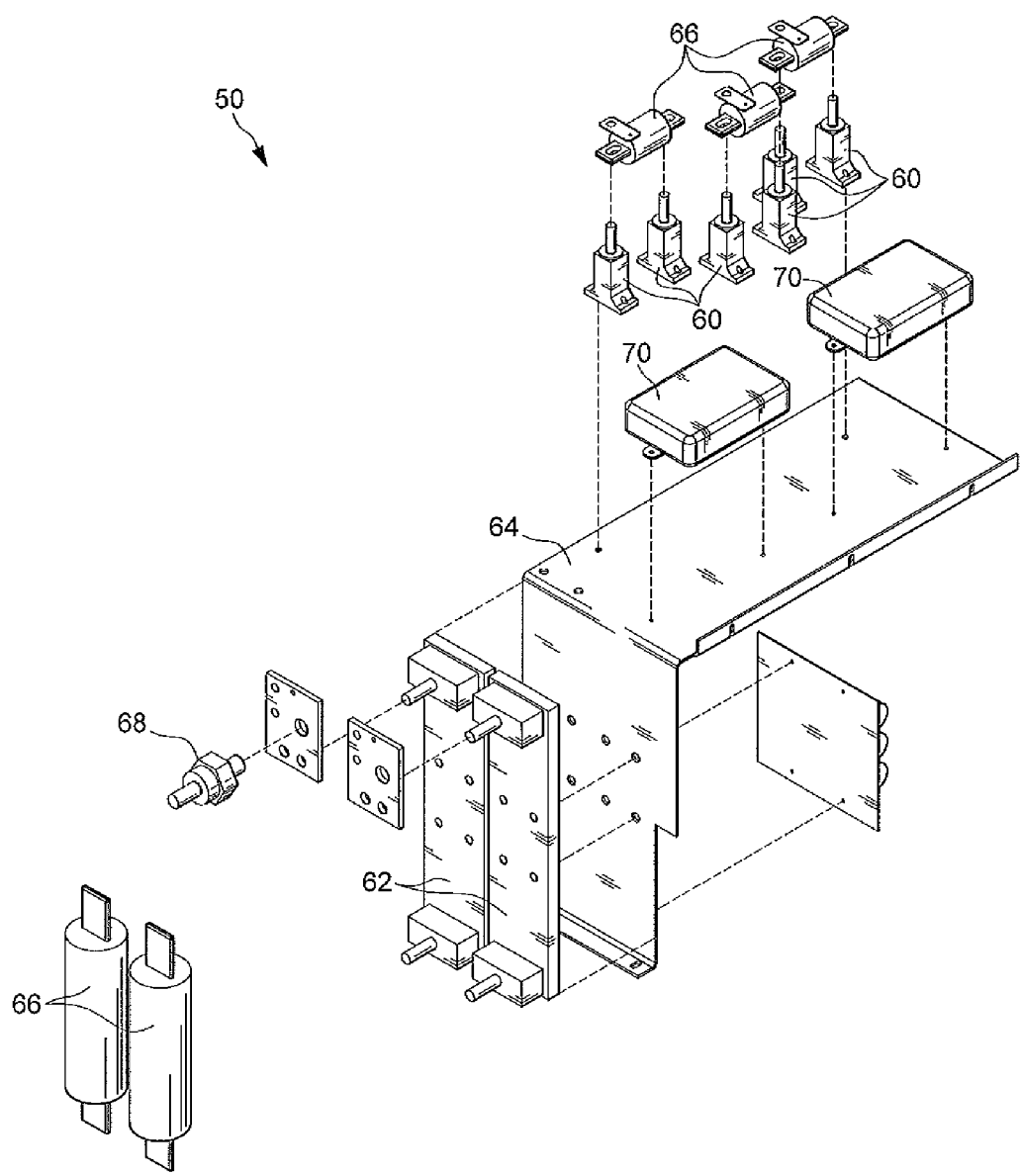
FIG. 14 is an exploded perspective view of a fuse plate according to an embodiment of the present invention.

As more clearly shown in FIG. 14, the fuse plate 50 includes at least one fuse block 60 and a fuse holder 62 coupled to a base plate 64 or bracket. At least one fuse 66 is coupled to each of the fuse block 60 and fuse holder 62. A terminal 68 (e.g. terminal plate, terminal stud, diode stud, and the like) and a plurality of varistors 70 (e.g. metal oxide varistor (MOV)) are also coupled the base plate 64 and in electrical communication with at least one of the fuse block 60 and the fuse holder 62. As a non-limiting example the varistors 70 include a DC MOV and an AC MOV. As a further non-limiting example, the varistors 70 are at least partially enclosed in a protective housing.

Figure 15:
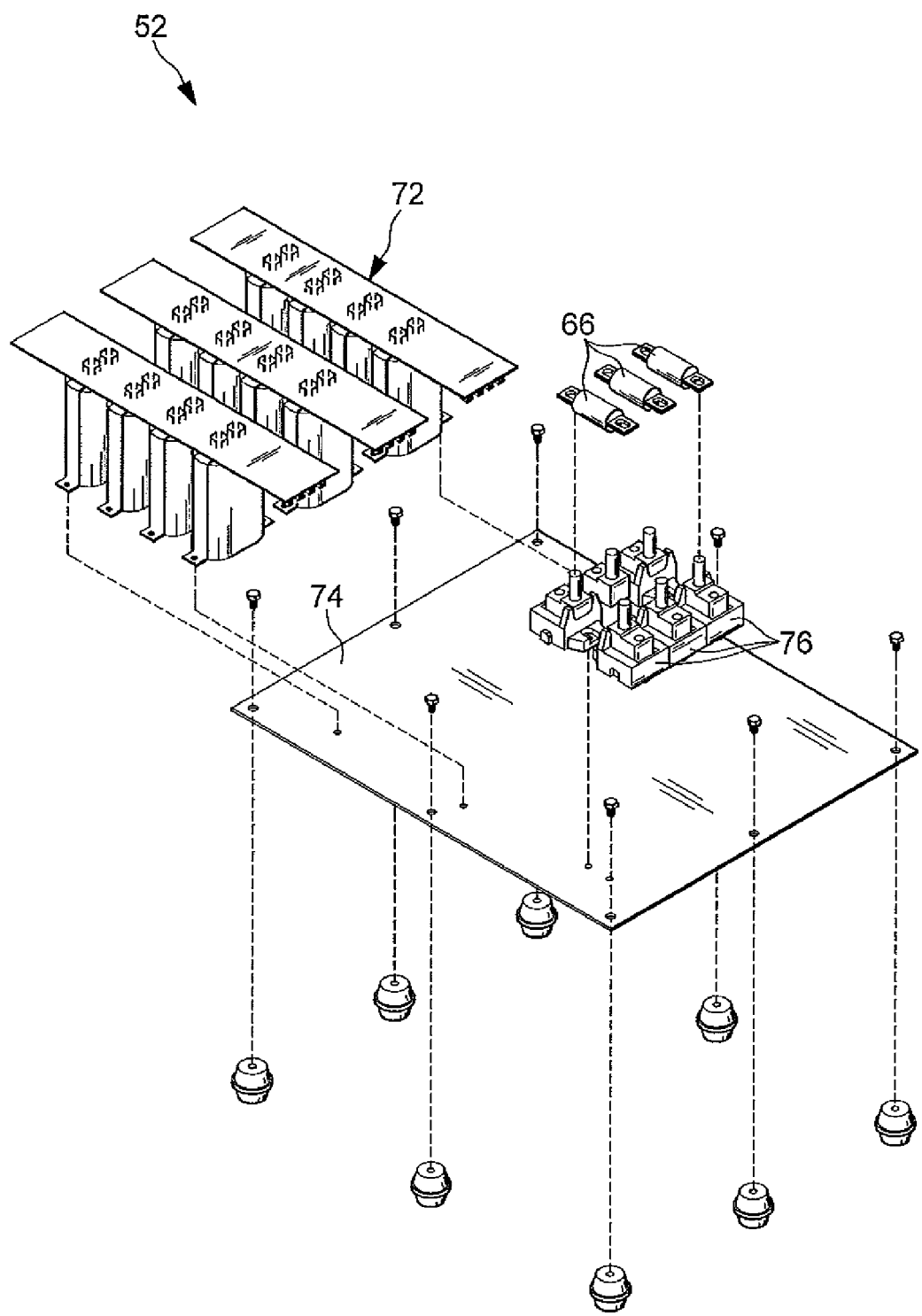
FIG. 15 is an exploded perspective view of a capacitor plate according to an embodiment of the present invention.
Figure 16:
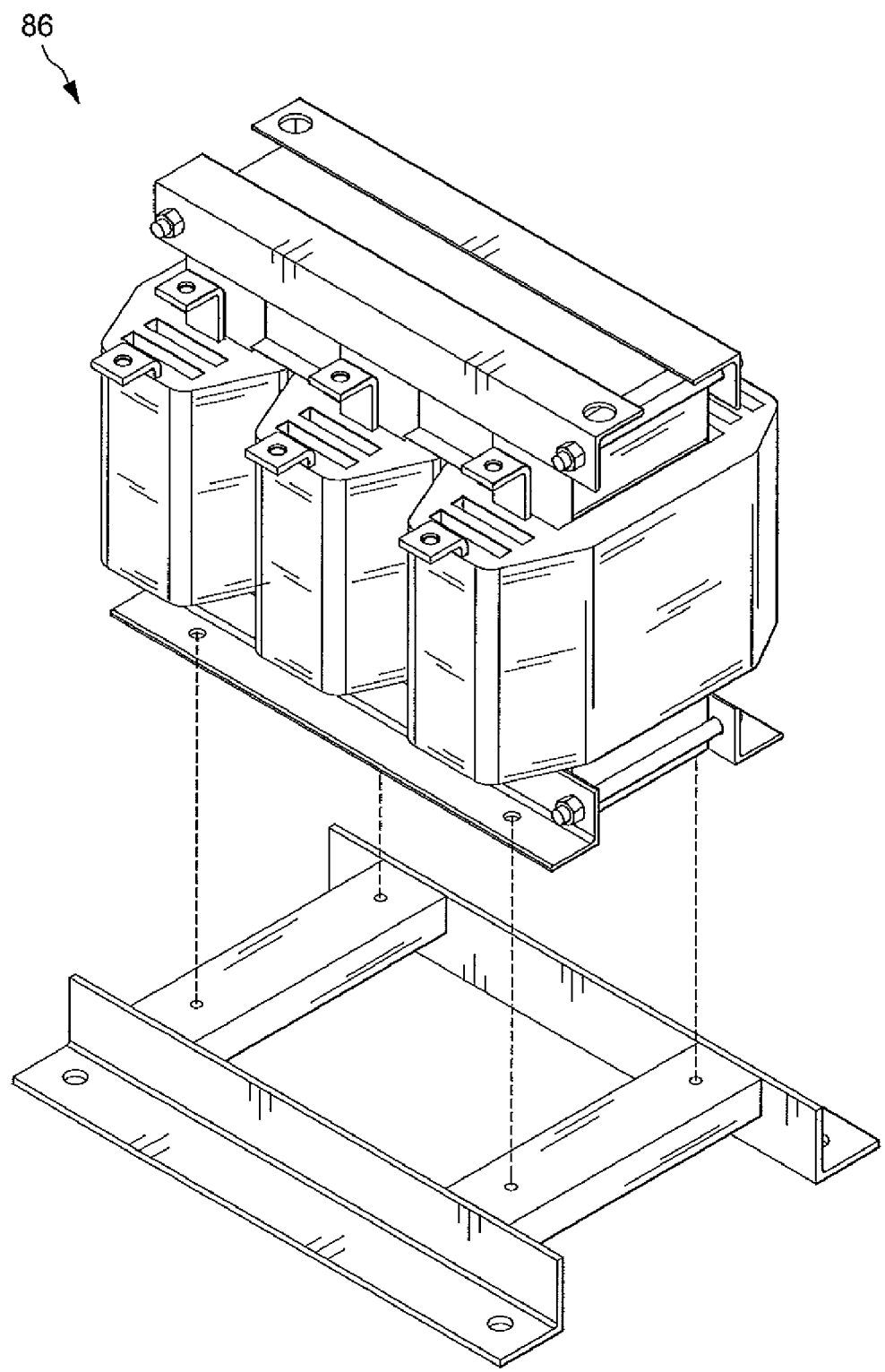
FIG. 16 is an exploded perspective view of a choke magnet according to an embodiment of the present invention.

As more clearly shown in FIG. 15, the capacitor plate 52 includes a capacitor bank 72 coupled to a base plate 74. A second fuse holder 76 is coupled the base plate 74 and includes at least one fuse 66 coupled thereto. In certain embodiments, a control transformer 78 is coupled to the capacitor plate 52 and in electrical communication with at least the inverter 54. In the embodiment shown, the control transformer 78 is disposed in the third chamber 32 and coupled to a floor 22 of the housing 12 to space the control transformer 78 from other electrical components (e.g. the capacitor plate 52 and the inverter 54). It is understood that the control transformer 78 can be mounted in any location. It is further understood that additional electrical components (e.g. capacitors, capacitor banks, resistors, and the like) can be mounted to other components such as the fuse plate 50, for example.

The second chamber 30 is disposed adjacent the first chamber 28 (e.g. adjacent a divided portion of the first chamber 28 referenced by the third chamber 32) and substantially sealed from at least a portion thereof. The second chamber 30 is further divided into a choke section 80 and a control section 82. Specifically, a choke housing 84 is coupled to the side wall 18 to separate the choke section 80 from the control section 82. As a non-limiting example, the choke housing 84 is generally "L" shaped to engage both the wall 16 and the wall 18 to seal the choke section 82 from the remaining portions of the chambers 28, 30, 32. It is understood that any shape and configuration may be used.

The side walls 16, 18 enclosing a portion of the choke section 80 include a plurality louvered apertures 85a for the ventilation thereof. Although louvers are shown, it is understood that other means for minimizing contamination from an outside environment may be used. In certain embodiments, a covering 85b or shroud is disposed adjacent the louvered apertures 85a to protect from ingress of undesirable elements. The choke section 80 includes a plurality of choke magnets 86 or coils. As a non-limiting example, the choke magnets 86 are inductors of an RLC circuit for AC filtering.

The side wall 18 enclosing a portion of the control section 82 includes at least one punch-out aperture 88 to provide a selective conduit for wiring and electrical connections. The control section 82 includes a disconnect plate 90 or switch plate and a connector plate (not shown). As a non-limiting example, the connector plate includes a plurality of high voltage insulators or standoffs for connecting to a DC input.

Figures 17, 18:
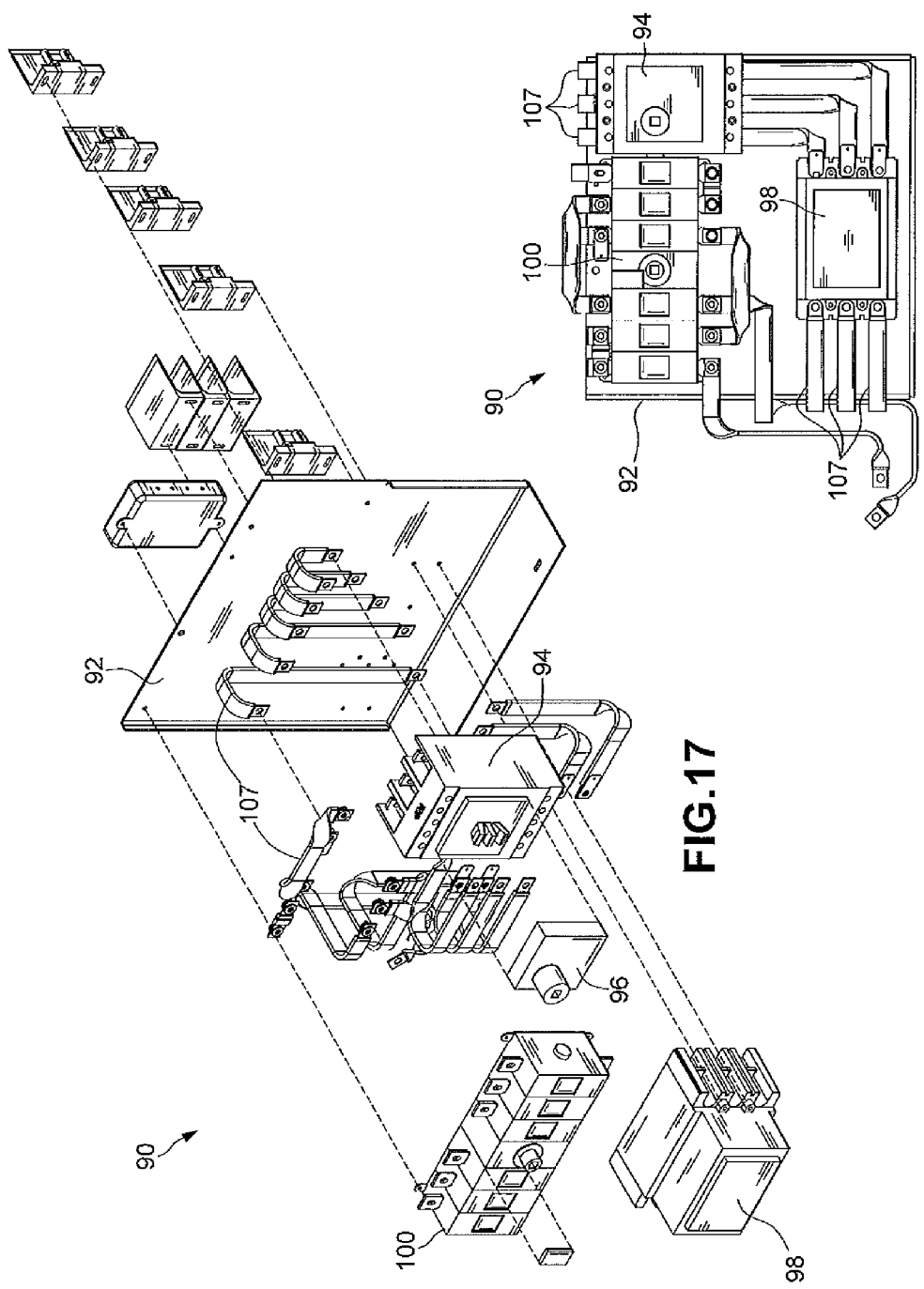
FIG. 17 is an exploded perspective view of a disconnect plate according to the present invention.
FIG. 18 is a front elevational view of the disconnect plate of FIG. 17.

As more clearly shown in FIGS. 17-18, the disconnect plate 90 includes a base bracket 92 for mounting the disconnect plate to the housing 12. The disconnect plate 90 also includes an AC breaker 94 having an operating mechanism 96 coupled thereto, a contactor 98, and a switch disconnect 100, wherein each of the components 94, 98, 100 is coupled to the base bracket 92.

Figure 2:
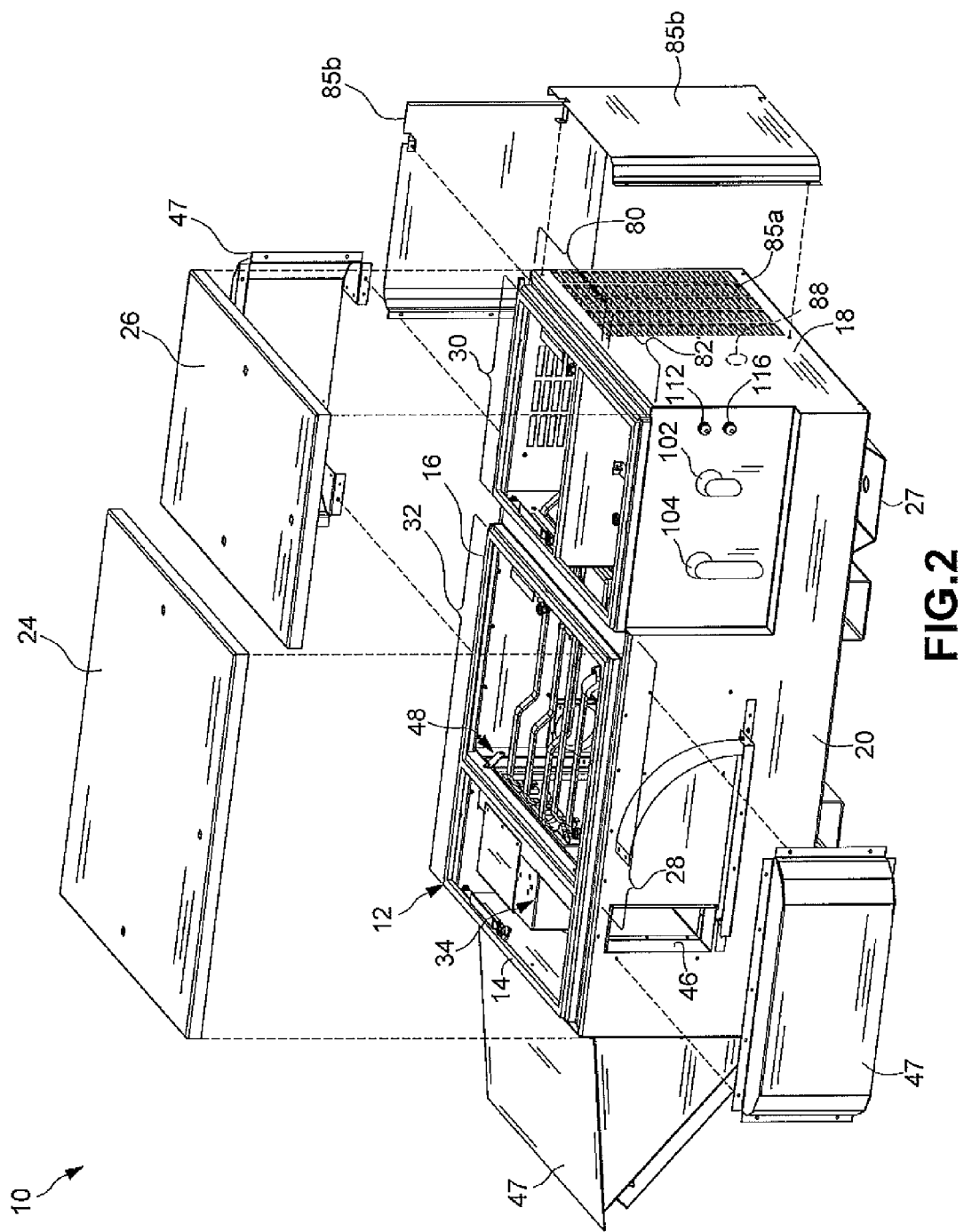
FIG. 2 is a partially exploded perspective view of the inverter system of FIG. 1.
Figure 3:
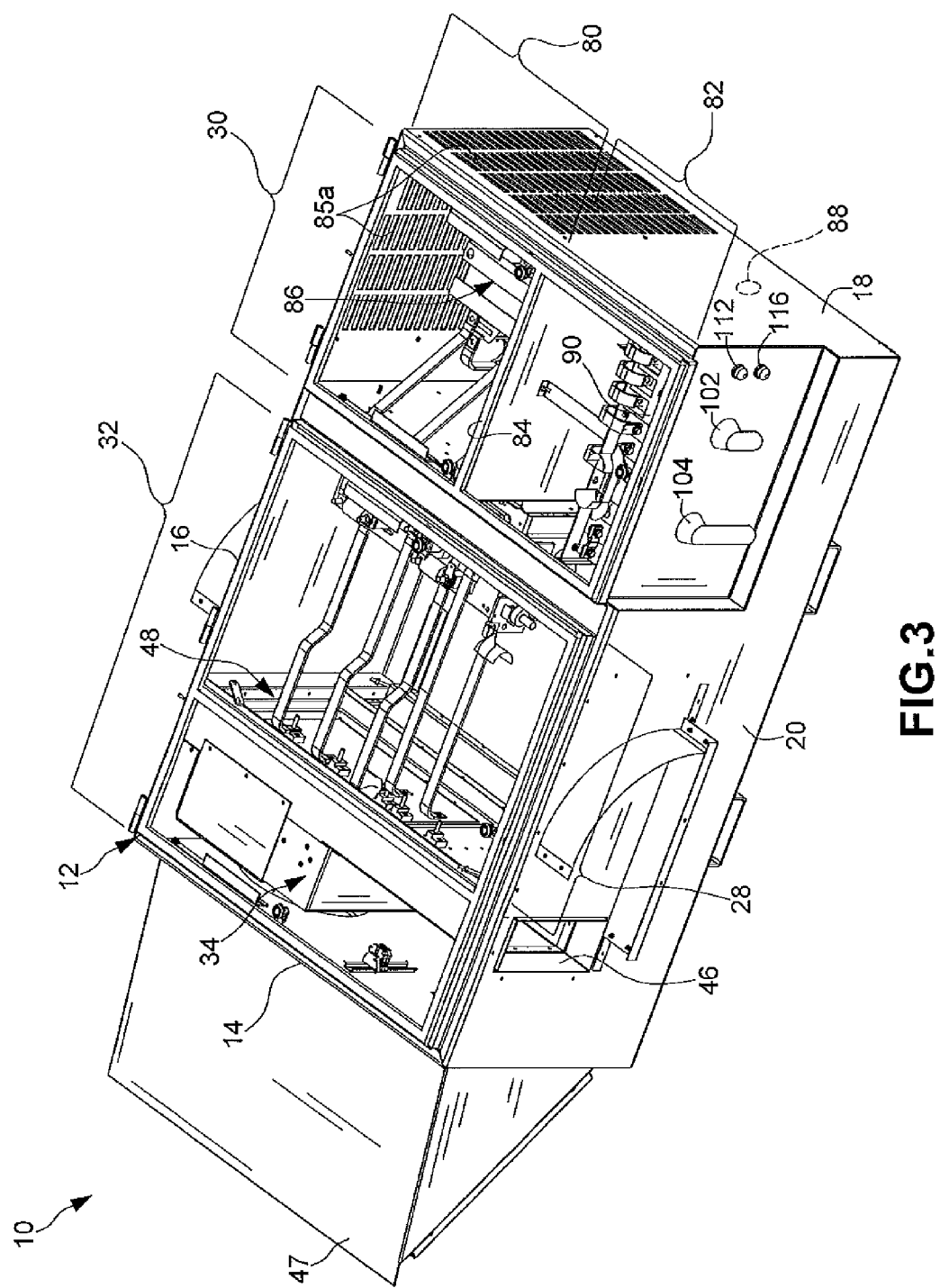
FIG. 3 is a perspective view of the inverter system of FIG. 1, shown with a cover removed.
Figure 4:
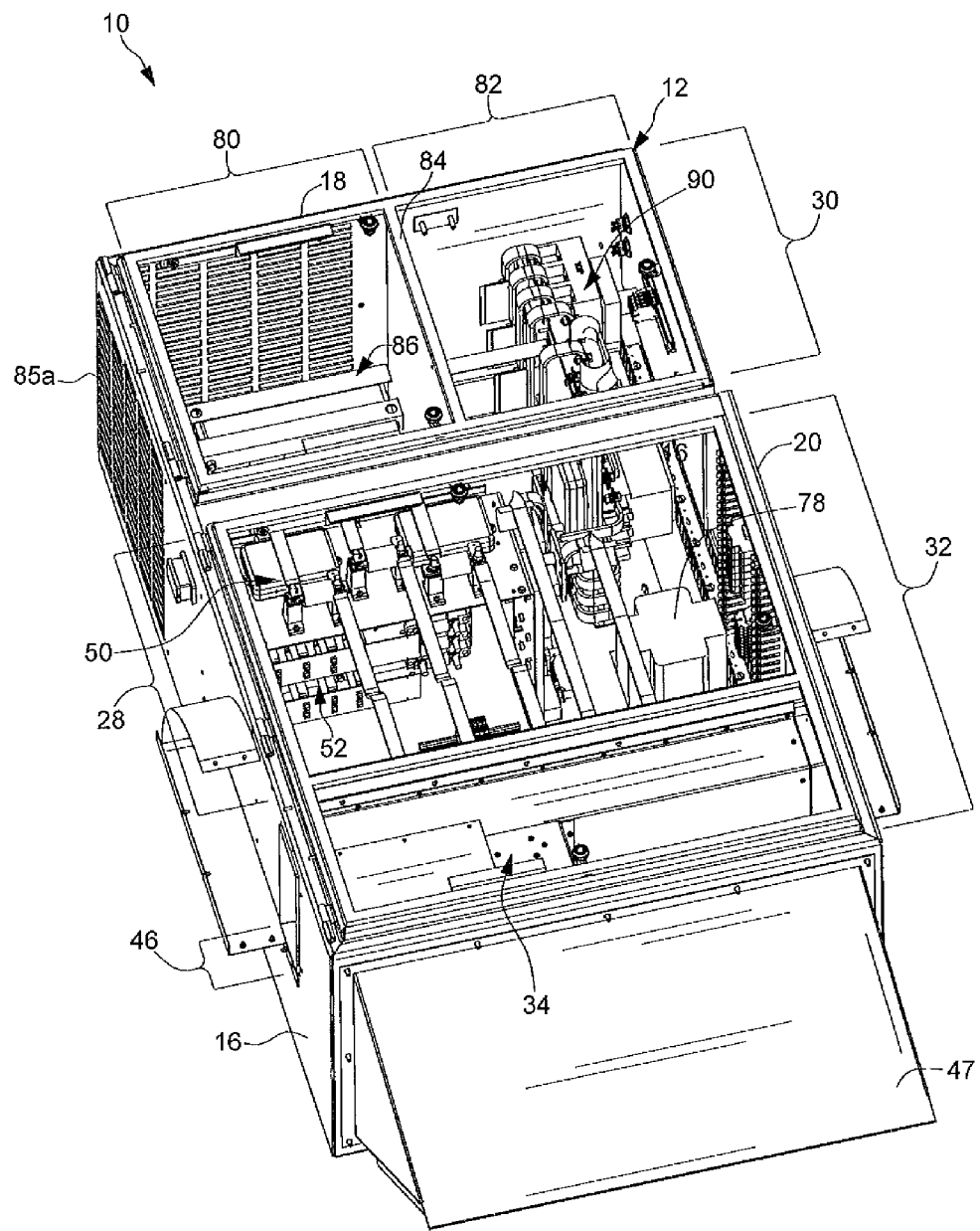
FIG. 4 is a perspective view of the inverter system of FIG. 1, shown with a cover removed.
Figure 5:
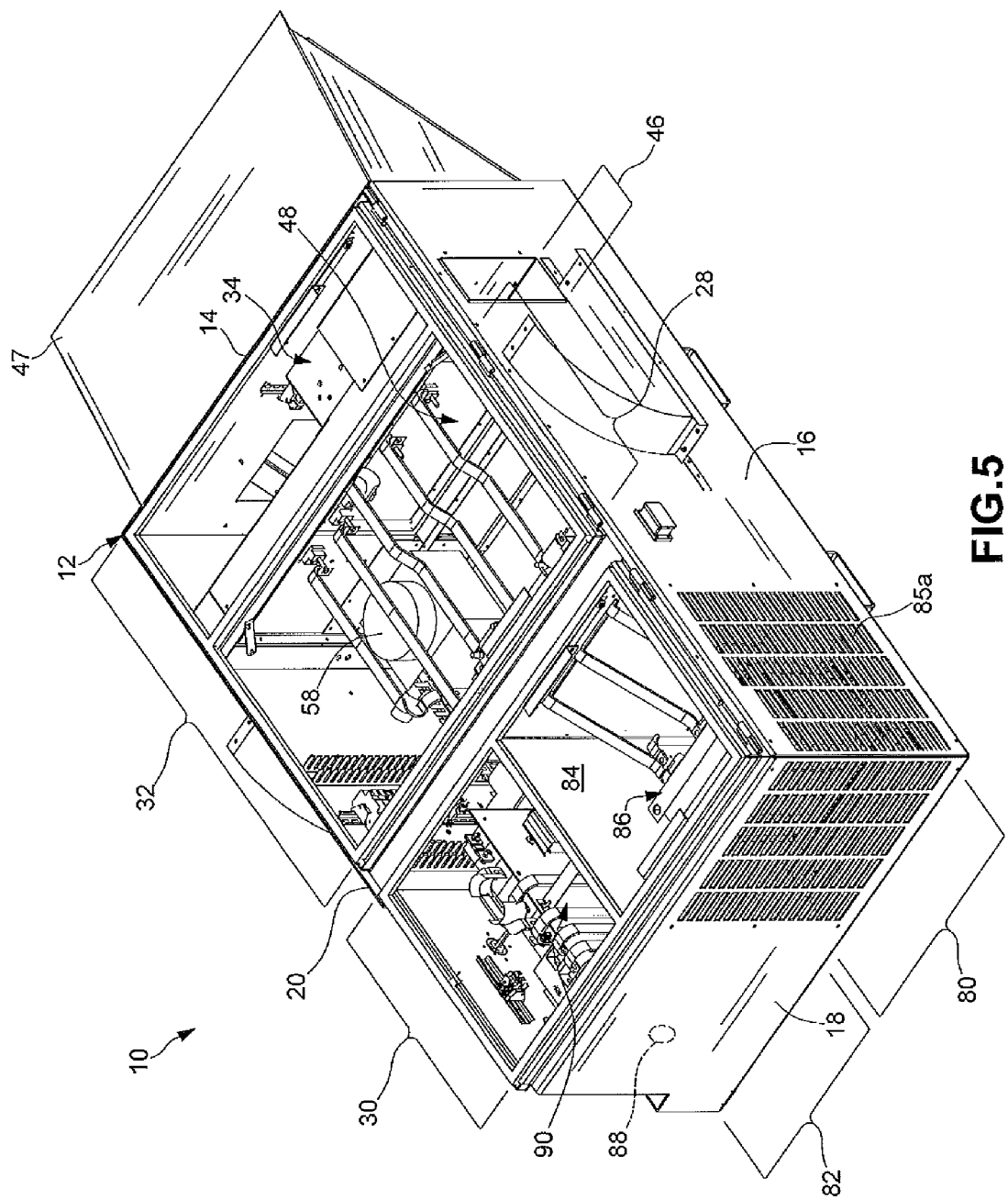
FIG. 5 is a perspective view of the inverter system of FIG. 1, shown with a cover removed.
Figure 6:
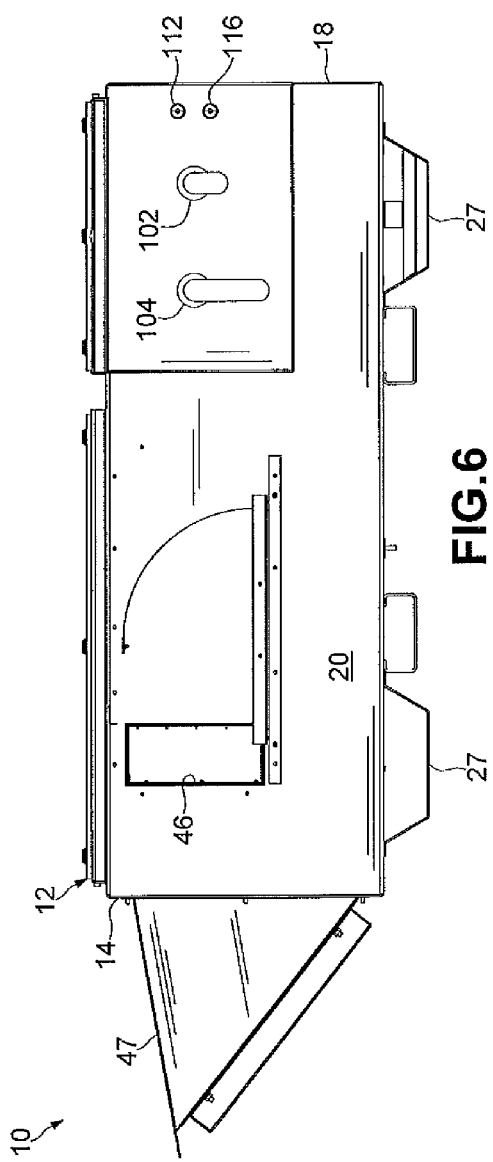
FIG. 6 is a left side elevational view of the inverter system of FIG. 1.
Figure 7:
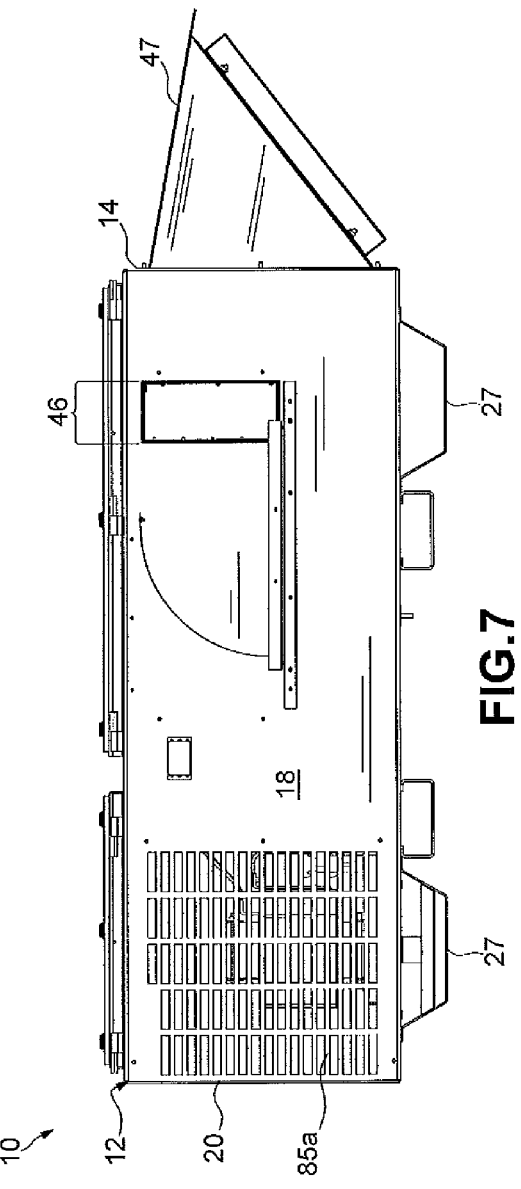
FIG. 7 is a right side elevational view of the inverter system of FIG. 1.
Figure 8:
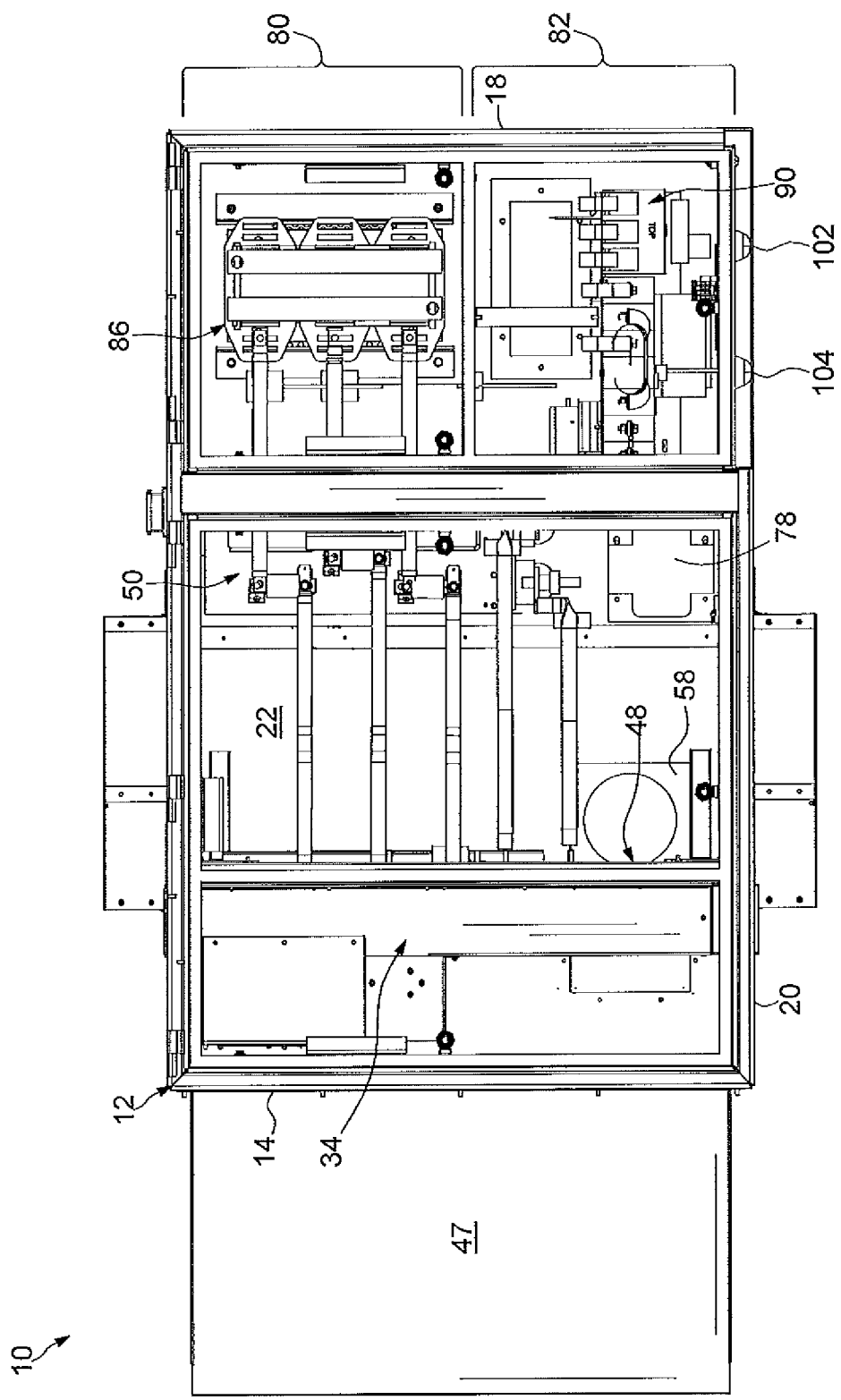
FIG. 8 is a top plan view of the inverter system of FIG. 1.
Figure 9:
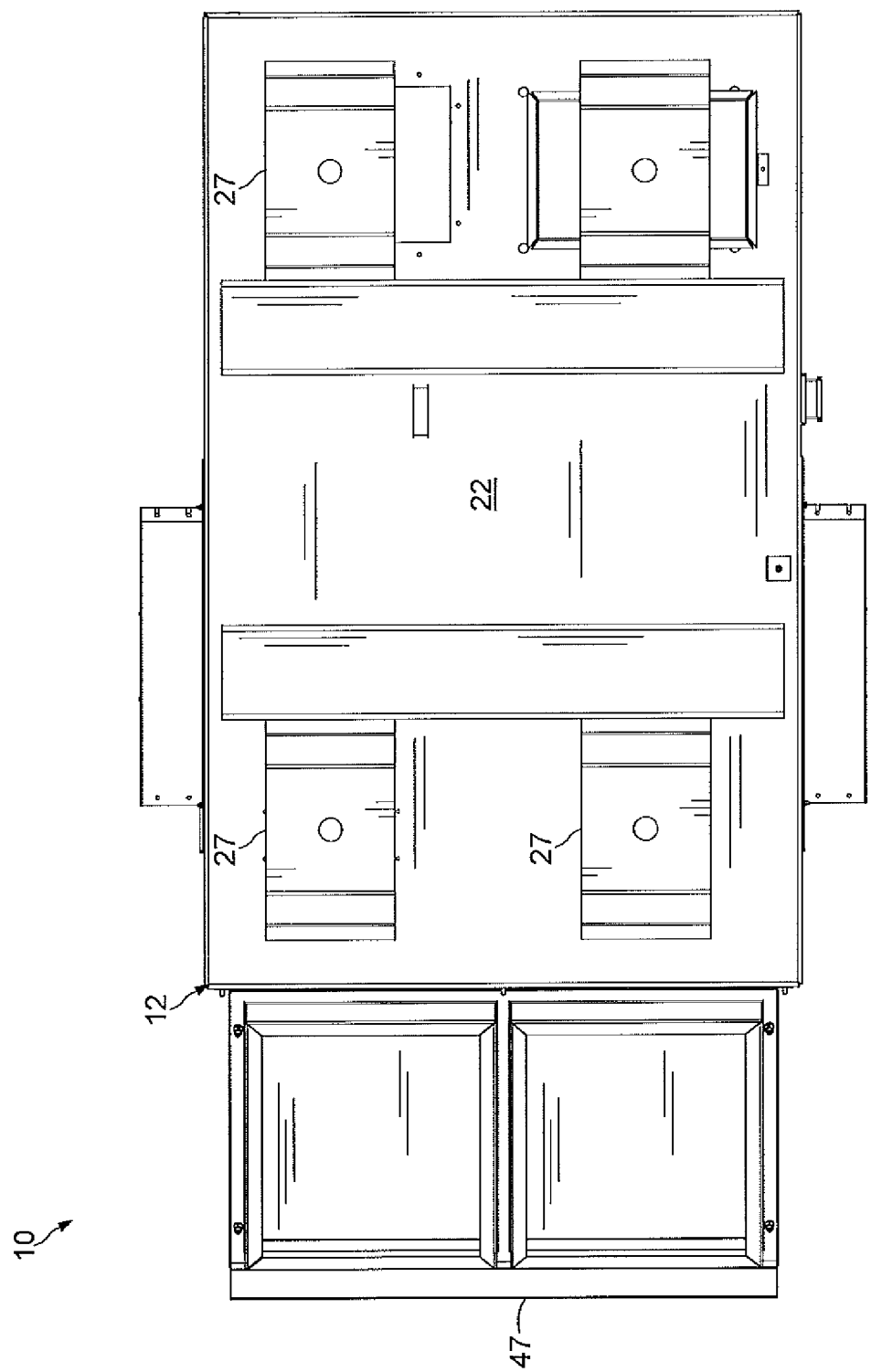
FIG. 9 is a bottom plan view of the inverter system of FIG. 1.
Figure 10:
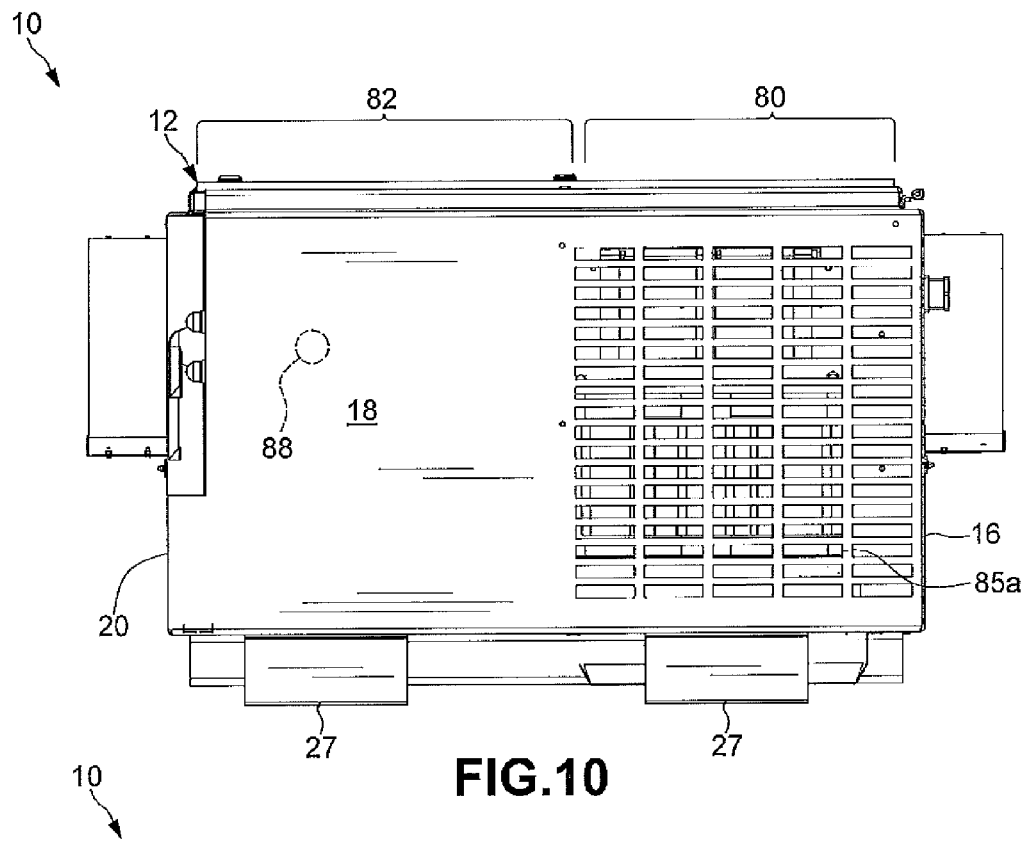
FIG. 10 is a front elevational view of the inverter system of FIG. 1.
Figure 11:
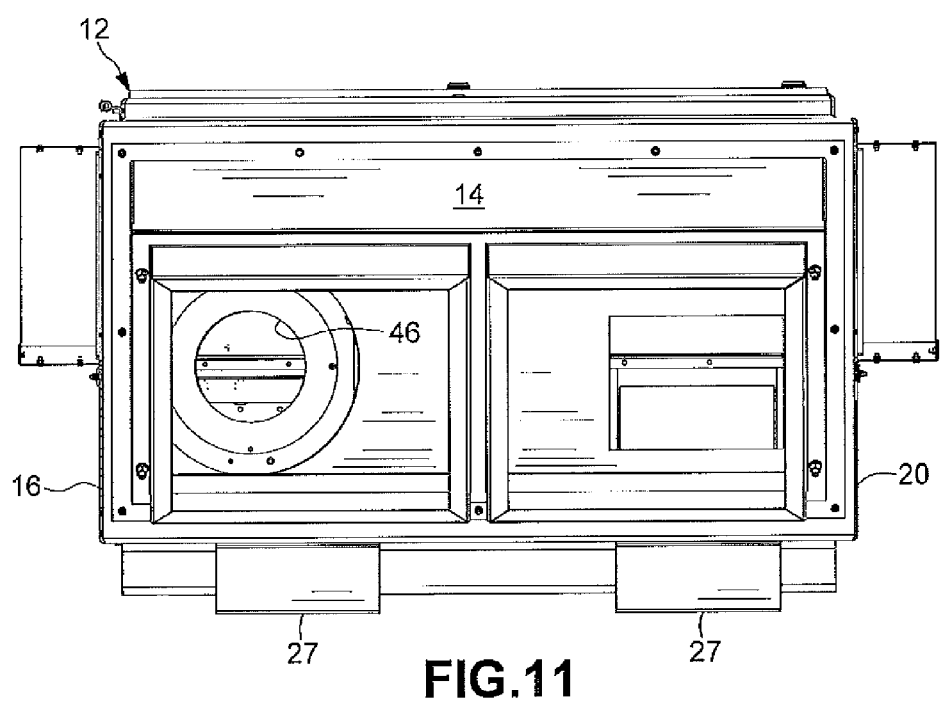
FIG. 11 is a rear elevational view of the inverter system of FIG. 1.

The AC breaker 94 is typically a three pole breaker having a breaker handle 102 or control member coupled thereto, as shown in FIGS. 1-3. However, other AC breakers can be used. The breaker handle 102 is disposed through an aperture in the housing 12 such that a portion of the breaker handle 102 may be accessed on an outside surface of the housing 12 for actuating the AC breaker 94 (e.g. via the operating mechanism 96). The contactor 98 is mounted on the base bracket 92 and in electrical communication with the AC breaker 94.

The switch disconnect 100 is typically a six pole disconnect having a disconnect handle 104 or control member coupled thereto, as shown in FIGS. 1-3. The disconnect handle 104 is disposed through an aperture in the housing 12 such that a portion of the disconnect handle 104 may be accessed on an outside surface of the housing 12 for actuating the switch disconnect 100. In certain embodiments, a fuse block (not shown) having at least one fuse (not shown) is in electrical communication with the switch disconnect 100. It is understood that a plurality of conductive leads 107 may be coupled to each of the AC breaker 94, the contactor 98, and the switch disconnect 100 to provide electrical communication with other electrical components.

Figure 19:
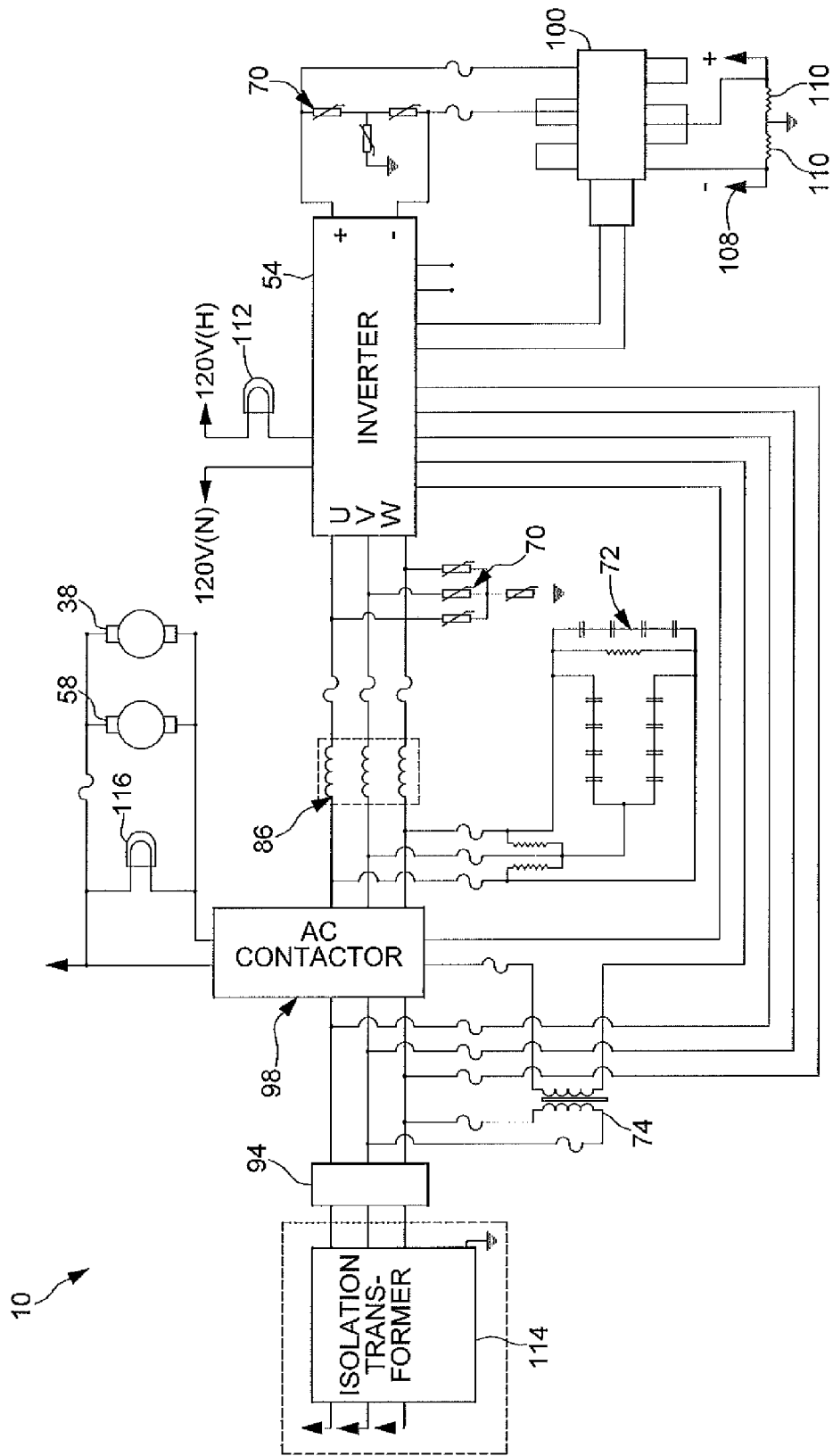
FIG. 19 is a schematic diagram of the inverter system of FIG. 1.

FIG. 19 illustrates a schematic diagram of the electrical interconnections for the components of the inverter system 10. As shown, the switch disconnect 100 is in electrical communication with a DC power input 108 received from a DC power source (not shown) such as a solar panel or solar array. As a non-limiting example, a plurality of resistors 110 is electrically coupled to the DC power input and a ground. The switch disconnect 100 applies an output voltage to the DC input of the inverter 54. As shown, a DC MOV of the varistors 70 is in electrical communication with the DC input of the inverter. Additionally, a fuse is interposed between the output of the switch disconnect 100 and the input of the inverter 54. A first light source 112 is in electrical communication with the inverter 54 and disposed to provide an operational signal to a user, such as normal operation or a fault condition, for example. It is understood that the first light source 112 may be positioned in any location, as shown in the drawings.

An output of the inverter 54 (e.g. three phase AC output—U, V, W) is transmitted to the choke magnets 86 or inductors. In certain embodiments, an AC MOV of the varistors 70 is in electrical communication with the AC output of the inverter 54. Additionally, a fuse is interposed between the output of the inverter 54 and the choke magnets 86. The capacitor bank 72 is in electrical communication with the choke magnets 86 and the contactor 98. As such, the AC output signal of the inverter 54 passes through the choke magnets 86 and to the contactor 98.

The contactor 98 is in electrical communication with the control transformer 74 and an external isolation transformer 114. It is understood that the contactor 98 may be in electrical communication with other electrical loads and devices for receiving the AC output signal of the inverter system 10. As a non-limiting example, the AC breaker 94 is interposed between the external utility transformer 114 and the contactor 98 to provide further protection to the inverter system 10.

The fan assembly 38 and the heat exchanger 58 are in electrical communication with the AC contactor 98 to be controlled thereby. As a non-limiting example, a second light source 116 is in electrical communication with at least one of the heat exchanger 58 and the fan assembly 38 and disposed to notify the user of an operation condition of heat exchanger 58 and fan assembly 38. It is understood that the second light source 116 may be positioned in any location, as shown in the drawings.

In operation, the inverter system 10 converts a DC electric current into an AC electric current at high voltages and without the need for an interstage coupling transformer when used in conjunction with a solar panel array. An arrangement of the components of the inverter system 10 allows the housing 12 to have low-profile dimensions as compared to the vertical stack inverters conventionally used with solar panel arrays. The removable covers 24, 26 and the punch-out apertures 88 provide selective maintenance access to the second chamber 30 without exposing the third chamber 32 to the outside environment. A user may make all necessary input and output wire connections to the inverter system 10, while the first chamber 28 and third chamber 32 are enclosed by the cover 24. In the event that the components enclosed in the first chamber 28 or third chamber 32 need to be accessed, the cover 24 is removed.

The chambers 28, 30, 32 of the inverter system 10 maximize a thermal management thereof. Specifically, the first chamber 28 includes the fan assembly 38 and the exhaust aperture 46 for maximizing the thermal transfer rate from the third chamber 32 through the heat sink 56 and the heat exchanger 58. Since the inverter assembly 48 cooperates with the heat sink assembly 34 to separate the first chamber 28 and third chamber 32, the components that may be affected by contaminants (e.g. the inverter 54, the fuse plate 50, the capacitor plate 52) are localized for maximum thermal management and isolation from damaging thermal build-up. As a non-limiting example, the heat exchanger 58 may operate to transfer thermal energy into the third chamber 32 to substantially equalize a temperature between the first chamber 28 and the second chamber 32, thereby minimizing condensation due to temperature variations therebetween. It is understood that the heat exchanger 58 may be used to direct a transfer of thermal energy between any of the chambers 28, 30, 32 and in any direction, as desired. It is further understood that the operation of the heat exchanger 58 and other thermal management components may be controlled based upon an air temperature of any of the chambers 28, 30, 32.

The separated chamber arrangement of the inverter system 10 also allows the choke magnets 86 (e.g. inductors) to be spaced from the sensitive components and independently ventilated into an outside environment, thereby providing maximum thermal management while protecting the magnetically-sensitive components from the induced magnetic field of the magnets.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A housing comprising:
    a first chamber having an exhaust aperture to provide fluid communication with an outside environment;
    a wall disposed in the first chamber and containing an electrical component, wherein a thermal energy generated by the electrical component is transferred from the first chamber to the outside environment through the exhaust aperture;
    a second chamber formed adjacent the first chamber and including a control means for the electrical component; and
    a means for selectively providing access to the first chamber and the second chamber.

2. The housing according to claim 1, further comprising a fan assembly in fluid communication with the exhaust aperture formed in the first chamber.

3. The housing according to claim 1, further comprising a heatsink assembly disposed adjacent the wall and in thermal communication therewith.

4. The housing according to claim 1, wherein the electrical component is an inverter.

5. The housing according to claim 1, wherein the control means includes a disconnect plate.

6. The housing according to claim 1, wherein the second chamber is further divided to define a choke section including a choke magnet disposed therein, the choke magnet spaced from the electrical component and the control means.

7. The housing according to claim 6, wherein the choke section includes a means for ventilating to the outside environment.

8. The housing according to claim 1, further comprising a control transformer disposed in the first chamber and in electrical communication with the electrical component.

9. A housing comprising:
    a first chamber having an exhaust aperture to provide heat transfer with an outside environment;
    a second chamber formed adjacent the first chamber and including a disconnect plate;
    a wall separating at least a portion of the first chamber to define a third chamber, the wall containing an inverter assembly in electrical communication with the disconnect plate, wherein at least a portion of the thermal energy generated by the inverter assembly is transferred from the first chamber to the outside environment through the exhaust aperture; and
    a means for selectively providing access to the first chamber and the second chamber.

10. The housing according to claim 9, further comprising a fan assembly in fluid communication with the exhaust aperture formed in the first chamber.

11. The housing according to claim 9, further comprising a heatsink assembly disposed in the first chamber adjacent the wall and in thermal communication with the inverter assembly.

12. The housing according to claim 11, wherein the inverter assembly includes a heat exchanger extending through the wall, the heat exchanger in thermal communication with the heatsink assembly.

13. The housing according to claim 11, wherein the inverter assembly includes a heat sink in thermal communication with the heatsink assembly.

14. The housing according to claim 9, wherein the inverter assembly includes an inverter for converting direct current to alternating current.

15. The housing according to claim 9, wherein the inverter assembly includes a heat exchanger extending through the wall.

16. The housing according to claim 9, wherein the second chamber is further divided to define a choke section including a choke magnet disposed therein, the choke magnet spaced from the electrical component and the control means.

17. A housing for an inverter comprising:
    a floor having a means to mount the housing in a substantially static position;
    a plurality of side walls coupled to the floor and at least partially defining:
        a first chamber having an exhaust aperture to provide fluid communication with an outside environment; and
        a second chamber adjacent the first chamber and including a control means;
    a chamber wall separating at least a portion of the first chamber to define a third chamber, the chamber wall containing an inverter assembly in electrical communication with the control means, wherein at least a portion of the thermal energy generated by the inverter assembly is transferred from the first chamber to the outside environment through the exhaust aperture;
    a heatsink assembly disposed in the first chamber adjacent the chamber wall and in thermal communication with the inverter assembly; and
    a means for selectively providing access to the first chamber and the second chamber.

18. The housing according to claim 17, wherein the inverter assembly includes a heat exchanger extending through the chamber wall and in direct thermal communication with the heat sink.

19. The housing according to claim 17, wherein the second chamber is further divided to define a choke section including a choke magnet disposed therein, the choke magnet spaced from the electrical component and the control means.

20. The housing according to claim 17, further comprising a control transformer mounted to the floor in the first chamber and in electrical communication with the electrical component.

* * * * *